(12) United States Patent
Frank et al.

(10) Patent No.: US 7,863,192 B2
(45) Date of Patent: Jan. 4, 2011

(54) METHODS FOR FULL GATE SILICIDATION OF METAL GATE STRUCTURES

(75) Inventors: Aaron Frank, Murphy, TX (US); David Gonzalez, Jr., Plano, TX (US); Mark R. Visokay, Wappingers Falls, NY (US); Clint Montgomery, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/965,024

(22) Filed: Dec. 27, 2007

(65) Prior Publication Data

US 2009/0170258 A1    Jul. 2, 2009

(51) Int. Cl.
*H01L 21/44* (2006.01)
(52) U.S. Cl. .............. 438/682; 438/199; 438/649; 438/678; 257/E21.165
(58) Field of Classification Search ........... 438/199, 438/649, 682; 257/E21.165
See application file for complete search history.

(56) References Cited

U.S. PATENT DOCUMENTS

| | | | | |
|---|---|---|---|---|
| 6,730,572 B2 * | 5/2004 | Lee et al. | ............. | 438/373 |
| 6,905,622 B2 * | 6/2005 | Padhi et al. | ............. | 216/52 |
| 2006/0258074 A1 | 11/2006 | Visokay et al. | | |
| 2007/0184652 A1 | 8/2007 | Frank et al. | | |

* cited by examiner

*Primary Examiner*—Matthew C Landau
*Assistant Examiner*—Jessica Hall
(74) *Attorney, Agent, or Firm*—Warren L. Franz; Wade J. Brady, III; Frederick J. Telecky, Jr.

(57) ABSTRACT

One embodiment relates to a method of fabricating an integrated circuit. In the method, p-type polysilicon is provided over a semiconductor body, where the p-type polysilicon has a first depth as measured from a top surface of the p-type polysilicon. An n-type dopant is implanted into the p-type polysilicon to form a counter-doped layer at the top-surface of the p-type polysilicon, where the counter-doped layer has a second depth that is less than the first depth. A catalyst metal is provided that associates with the counter-doped layer to form a catalytic surface. A metal is deposited over the catalytic surface. A thermal process is performed that reacts the metal with the p-type polysilicon in the presence of the catalytic surface to form a metal silicide. Other methods and devices are also disclosed.

23 Claims, 7 Drawing Sheets

METHODS FOR FULL GATE SILICIDATION OF METAL GATE STRUCTURES

FIELD OF INVENTION

The present invention relates generally to semiconductor devices and more particularly to methods manufacturing semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. As transistor devices are scaled to reduce the dimensions, a number of problems have been presented. For example, use of a very thin gate dielectric causes high gate current leakage, which reduces device performance. Additionally, as a transistor device is scaled, a higher doping level is required in channel regions to mitigate short channel effects. In turn, such a high doping level decreases drive current and can yield undesired drain to channel tunneling current.

Currently, polysilicon gate structures are commonly employed in transistor devices because such devices have a fixed work function defined by a level of doping of a particular species or type. For example, an n-type transistor wherein the gate, source, and drain are doped with n-type dopant results in a work function of approximately 4.1 eV. As another example, a p-type transistor wherein the gate, source, and drain are doped with boron results in a work function of about 5.1 eV. The work function for transistor devices with polysilicon gate structures can be at least partly adjusted and/or selected by controlling the dopant levels within the gate. For example, decreasing the dopant levels for an n-type transistor device with a polysilicon gate increases the work function whereas decreasing the dopant levels for a p-type transistor device with a polysilicon gate decreases the work function. However, the use of polysilicon as a gate material also introduces problems. For example, polysilicon gate structures tend to suffer from polysilicon depletion and/or boron penetration effects, thereby degrading transistor device performance.

Metal gate structures can be employed in place of polysilicon in order to overcome or mitigate the problems associated with using polysilicon as a gate material. Metal gate structures do not suffer from polysilicon depletion and/or boron penetration effects. However, the work functions for metal gate structures are generally not as easily tuned as with polysilicon gate structures.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a method of fabricating a semiconductor device. In the method, p-type polysilicon is provided over a semiconductor body, where the p-type polysilicon has a first depth as measured from a top surface of the p-type polysilicon. An n-type dopant is implanted into the p-type polysilicon to form a counter-doped layer at the top-surface of the p-type polysilicon, where the counter-doped layer has a second depth that is less than the first depth. A catalyst metal is provided that associates with the counter-doped layer to form a catalytic surface. A metal is deposited over the catalytic surface. A thermal process is performed that reacts the metal with the p-type polysilicon to form a metal silicide.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
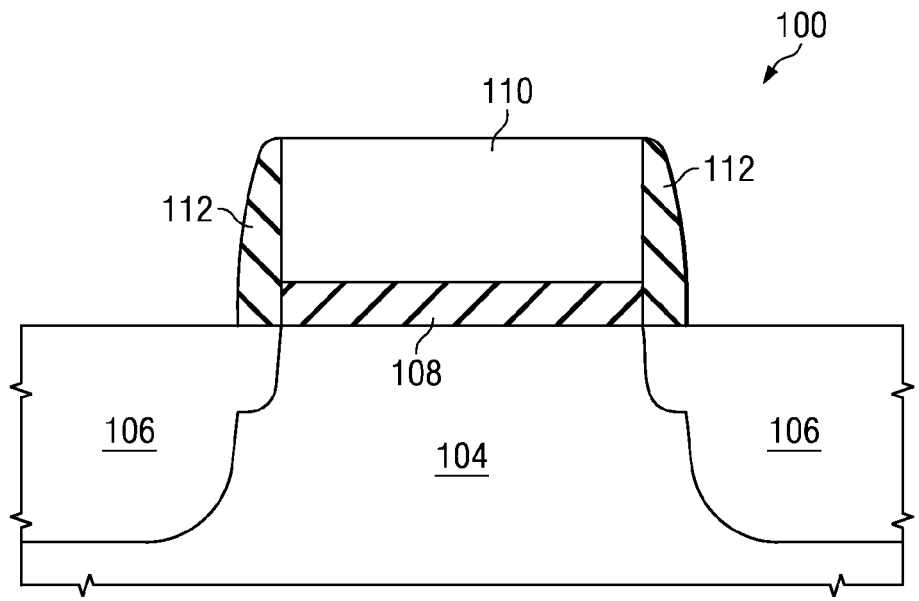
FIG. 1 is a cross sectional view of a conventional transistor device formed with a dielectric layer and a conventional, polysilicon gate.

One or more implementations of the present invention will now be described with reference to the attached drawings, wherein like reference numerals are used to refer to like elements throughout, and wherein the illustrated structures are not necessarily drawn to scale.

Aspects of the present invention facilitate selective electroless plating of metal on doped polysilicon, particularly p+ polysilicon. Although aspects of the present invention may be applicable to any type of semiconductor processing (e.g., Micro Electro-Mechanical Systems (MEMS), transistor processing, etc.), several embodiments will be discussed below in the context of fabricating a semiconductor transistor. In this fabrication method, metal gate structures are formed via a full silicidation process that converts polysilicon into metal silicide. Generally, work functions for metal gate based transistor devices are not controlled by doping gate materials, but the silicidation process with the prior doping of the present invention effectively allows adjusting the work function for transistor devices. Additionally, the silicide process of the present invention employs a selective metal deposition that mitigates structures or avoids silicide formation on active regions, including source/drain regions, of the transistor devices.

FIG. 1 is a cross sectional view of a conventional transistor device 100 formed with a dielectric layer and a conventional polysilicon gate. This view illustrates the benefits and detriments of employing polysilicon as a material in formation of the gate. The work function and resulting threshold voltage for the device 100 are at least partially a function of the doping of the polysilicon gate.

The device 100 comprises a well region 104 formed within a semiconductor substrate or body. Generally, if the device 100 is an n-type device (e.g., NMOS), then the well region 104 is formed by implanting a p-type dopant (e.g., boron) and if the device 100 is a p-type device (e.g., PMOS) the well region 104 is formed by implanting an n-type dopant, such as phosphorous, into the semiconductor body with a relatively low dose and high energy. Source/drain regions 106 are formed within the well region 104 by implanting a dopant with opposite conductivity of the well region 104. The source/drain regions 106 can also include extension regions.

A gate structure or stack overlies the channel and includes a dielectric layer 108 and a polysilicon layer 110 formed on the dielectric layer 108. Typically, the dielectric layer 108 is formed over the device 100, the polysilicon layer 110 is formed thereon, and a patterning operation is performed that selectively removes portions of the dielectric layer 108 and the polysilicon layer 110 leaving the gate structure.

The polysilicon layer 110 is implanted with a dopant species or type, such as boron, typically during formation of the source/drain regions 106. Sidewalls 112 are formed on lateral edges of the gate structure in order to protect the gate structure and facilitate formation of the source/drain regions 106. The sidewalls 112 can be formed by depositing an insulative material, such as silicon nitride, silicon dioxide, silicon oxynitride or any combination, over the device conformally and then anisotropically etching the layer.

The device 100 operates when a sufficient voltage, referred to as a threshold voltage, or greater is applied to the polysilicon layer 110 of the gate structure. The threshold voltage generates a sufficient electric field across a channel region below the gate structure such that a conductive path is formed below the gate structure between the source/drain regions 106 allowing current to flow therebetween. The threshold voltage is a result of the work function of the device 100, which is a function of the doping of the channel region, the source/drain regions 106, and the polysilicon gate 110.

As a result, the threshold voltage can be tuned at least partially by the dopant concentration of the polysilicon gate 110. For example, decreasing the polysilicon dopant level for an n-type transistor device increases the work function whereas decreasing the polysilicon dopant level for a p-type transistor device with a polysilicon gate decreases the work function. However, the use of polysilicon as a gate material also introduces problems. For example, polysilicon gate structures tend to suffer from polysilicon depletion and/or boron penetration effects, thereby degrading transistor device performance. In polysilicon depletion, for example, the charged electrical carriers in the polysilicon gate do not line up at the gate dielectric/polysilicon interface, but rather adhere to a space-charge distribution in the polysilicon.

Figure 2:
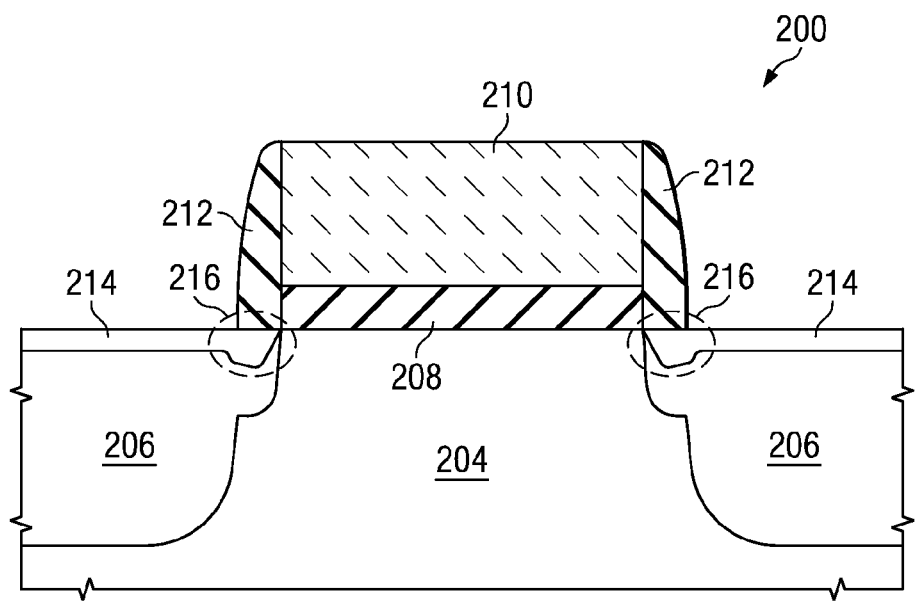
FIG. 2 is a cross sectional view of another conventional transistor device formed with a metal gate instead of a polysilicon gate.

FIG. 2 is a cross sectional view of another conventional transistor device 200 formed with a metal gate instead of a polysilicon gate. The metal gate overcomes some of the problems associated with conventional polysilicon gate structures, such as polysilicon depletion. For example, in contrast to carriers in the polysilicon gate, charged electrical carriers on a metal gate will tend towards the outer surface of the metal. Because charges in the metal gate will line up at the gate dielectric/metal interface, the metal gate provides devices with lower capacitances and faster switching times.

The device 200 comprises a well region 204 formed within a semiconductor substrate or body. Generally, if the device 200 is an n-type device (e.g., NMOS), then the well region 204 is formed by implanting a p-type dopant (e.g., boron) and if the device 200 is a p-type device (e.g., PMOS) the well region 204 is formed by implanting an n-type dopant, such as phosphorous, into the semiconductor body with a relatively low dose and high energy. Source/drain regions 206 are formed within the well region 204 by implanting a dopant with opposite conductivity of the well region 204. The source/drain regions 206 can also include extension regions.

A gate structure or stack overlies the channel and includes a dielectric layer 208 and a gate layer 210 formed on the dielectric layer 208. Typically, the dielectric layer 208 is formed over the device 200, the gate layer 210 is formed thereon, and a patterning operation is performed that selectively removes portions of the dielectric layer 208 and the gate layer 210 leaving the gate structure. The gate layer 210 is initially comprised of polysilicon.

The gate layer 210 is doped with a dopant species or type, such as boron, typically during formation of the source/drain regions 206. Sidewalls 212 are formed on lateral edges of the gate structure in order to protect the gate structure and facilitate formation of the source/drain regions 206. The sidewalls 212 can be formed by depositing an insulative material, such as silicon nitride, silicon dioxide, silicon oxynitride or any combination, over the device conformally and then anisotropically etching the layer. As with the device 100, the doping levels of the polysilicon layer 210 at least partially determine the work function for the device.

A full gate silicidation process is performed wherein a metal, such as nickel, is blanket deposited over the device and a thermal operation is performed that causes the polysilicon to react with the deposited nickel and convert the gate layer 210 from polysilicon into metal silicide.

As stated above, the threshold voltage can be tuned at least partially by the dopant concentration of the gate layer 210 prior to silicidation. For example, decreasing the dopant levels for an n-type transistor device increases the work function whereas decreasing the dopant levels for a p-type transistor device with a polysilicon gate decreases the work function. The conversion of the polysilicon into metal silicide via the full gate silicidation process retains the impact of the doping on the work function and the threshold voltage and overcomes some of the problems associated with employing polysilicon as a gate material (e.g., poly depletion).

However, the full gate silicidation process also causes the metal to react with the material within the source/drain regions 206 and form overly thick silicide regions 214 within the source/drain regions 206. Furthermore, the silicide process can also create silicide defect regions 216 that undesirably shorten the channel length and can result in shorting the channel.

One conventional mechanism employed to avoid or mitigate the overly thick silicide regions 214 is to employ a blocking layer or capping layer during deposition and annealing of the metal. The blocking layer mitigates reaction of the metal on the source/drain regions and, therefore, formation of silicide regions therein. However, the inventors of the present invention recognize that despite employing blocking layers, the undesired silicide defect regions 216 still form under sidewall spacers 212 and degrade performance of the device 200. This occurs due to incomplete blocking of metal diffusion by the blocking layer during annealing to form the fully silicided gate. Since metal is present on the source/drain regions, any weak points in the blocking layer (for example pinholes, cracks, voids, edges and the like) will allow metal to penetrate past the blocking layer and react with the silicon substrate.

In these conventional methods, the metal is typically deposited over the entire top surface of the semiconductor wafer (e.g., gate structures, source/drain regions, etc.). Due to the fact that one area of the wafer may have a denser layout (i.e., more gate structures per unit area) than another area of the wafer, the metal:silicon stoichiometry may vary over the devices across the wafer. Because the work function depends on the doping of the channel region, the source/drain regions 106, and the polysilicon gate 110; these devices associated with the different areas may have different voltage thresholds from one another. This is typically undesirable.

Figure 3:
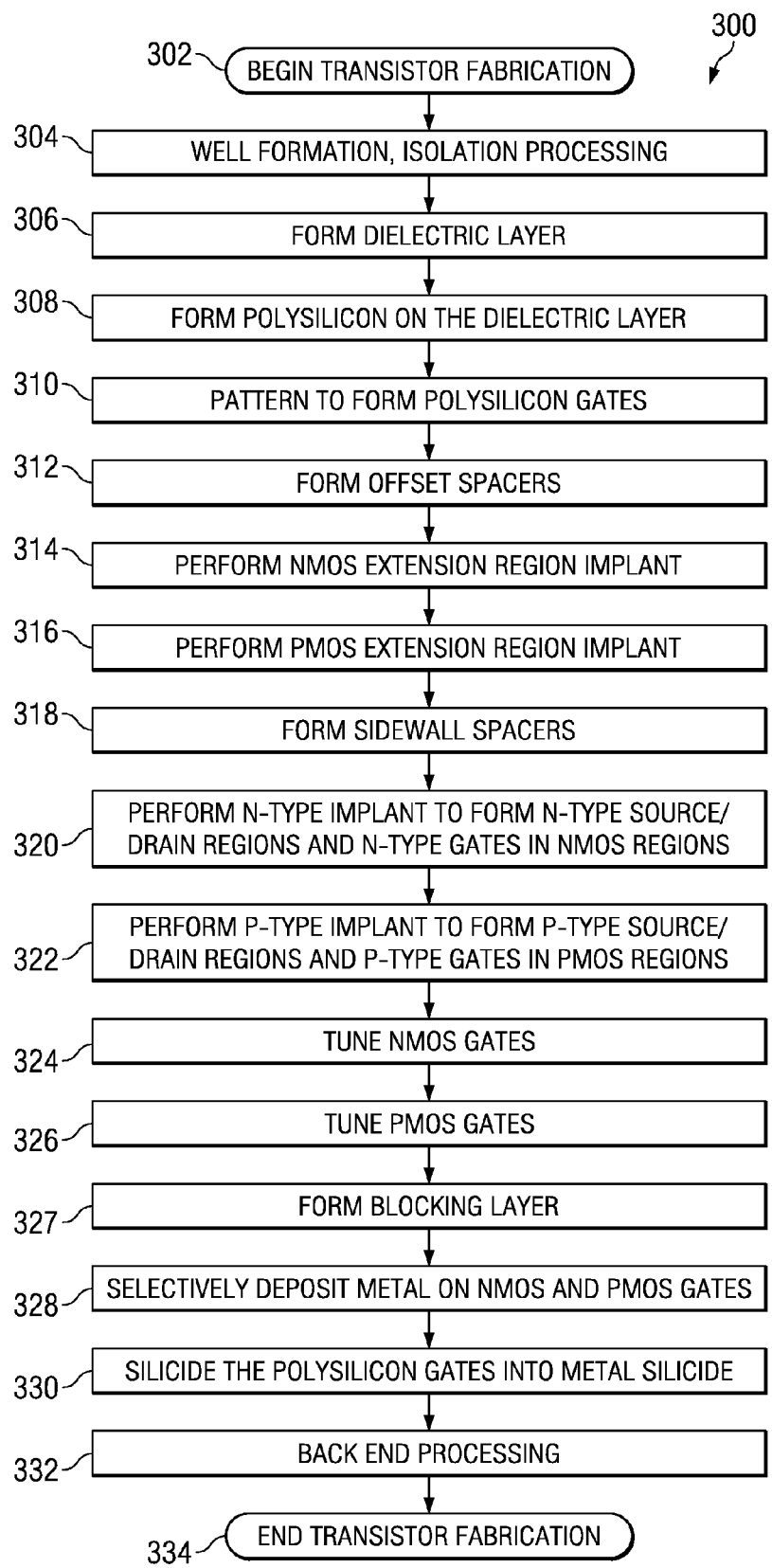
FIG. 3 is a flow diagram illustrating a method of fabricating a semiconductor device that forms metal gate structures via a silicidation process while mitigating formation of undesired source/drain silicide defect regions in accordance with an aspect of the present invention.

FIG. 3 is a flow diagram illustrating a method 300 of fabricating a semiconductor device that forms metal gate structures via a silicidation process while mitigating formation of undesired source/drain silicide defect regions and providing a relative uniform voltage threshold distribution across the wafer. While the exemplary method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 300 begins at block 302, wherein transistor fabrication is initiated, and transistor well formation and isolation processing is performed at block 304 thereby defining NMOS and PMOS regions of a semiconductor substrate or body, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another. The semiconductor substrate or body comprises a semiconductor material, such as silicon and/or germanium, or silicon on insulator materials.

The method 300 continues at block 306, wherein a dielectric layer is formed in active areas defined by the various formed isolation regions. In one example, the dielectric layer comprises a thin, thermally grown silicon dioxide layer, however, other type gate dielectrics (such as silicon oxy-nitrides and high-k dielectrics) may be formed and are contemplated by the present invention. A gate layer is then formed at block 308 by depositing polysilicon on the dielectric layer. A suitable deposition process is employed for depositing the polysilicon, such as via chemical vapor deposition (CVD). The gate layer and, optionally, the dielectric layer are patterned at block 310 to form gate structures comprised of the gate layer and the dielectric layer within both the NMOS and PMOS regions. Generally, a resist mask is employed to pattern the gate layer and the dielectric layer via etching to form gate structures in both NMOS and PMOS regions, respectively and such etching can comprise multiple etching steps.

An offset spacer is then formed on lateral edges of the conductive gate electrodes at block 312. For example, a thin offset layer (e.g., a silicon dioxide, silicon nitride, or silicon oxynitride layer) is formed generally conformally over the patterned gate and then etched using a generally anisotropic dry etch to remove offset layer material on top of the gate and in the source/drain regions, leaving a thin offset spacer material on lateral edges of the gate.

An NMOS extension region implant is then performed at block 314 to form NMOS extension regions, wherein n-type dopants are introduced in active regions of the device within the NMOS region. For example, lightly doped, medium doped or heavily doped extension region implants are performed in the NMOS regions (e.g., by masking off the PMOS regions), respectively, wherein the gate structures serve to self-align the extension regions. A thermal process such as a rapid thermal anneal can then be employed to activate the extension region dopants, which causes the extension regions to diffuse laterally slightly underneath the offset spacer toward the channels.

A PMOS extension region implant is then performed at block 316 to form PMOS extension regions, wherein p-type dopants are introduced in active regions of the device within the PMOS region. For example, lightly doped, medium doped or heavily doped extension region implants are performed in the PMOS regions (e.g., by masking off the NMOS regions), respectively, wherein the gate structures serve to self-align the extension regions. As with the NMOS extension regions, a thermal process such as a rapid thermal anneal can then be employed to activate the extension region dopants, which causes the extension regions to diffuse laterally slightly underneath the offset spacer toward the channels.

Still referring to FIG. 3, sidewall spacers are then formed on the gate structures at block 318. The sidewall spacers comprise an insulating material such as a silicon dioxide, a silicon nitride, a silicon oxynitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

NMOS source/drain regions are formed at block 320 by performing an NMOS source/drain implant with an n-type dopant. Source/drain regions are formed within the NMOS region by masking the PMOS region with a resist mask, exposing the NMOS region, and implanting n-type dopants (e.g., phosphorous). PMOS source/drain regions are formed at block 322 by performing a PMOS source/drain implant with an n-type dopant. Source/drain regions are formed within the PMOS region by masking the NMOS region with a resist mask, exposing the PMOS region, and implanting p-type dopants (e.g., boron). The source/drain dopant is introduced into the exposed areas (top of gate electrode and active areas not covered by the sidewall spacers).

The NMOS gate structures within the NMOS region are tuned/adjusted by performing an adjustment implant at block 324. The implant alters the dopant concentration of the NMOS gate structures in order to modify the work function and resulting threshold voltage obtained. The dopant concentration obtained is associated with a selected threshold voltage for the device.

The PMOS gate structures within the PMOS region are tuned/adjusted by performing an adjustment implant at block 326. The implant alters the dopant concentration of the PMOS gate structures in order to modify the work function and resulting threshold voltage obtained. The dopant concentration obtained is associated with a selected threshold voltage for the device.

It is appreciated that the adjustments performed above at blocks 324 and 326 can be performed during, prior to, and/or after the source/drain implants and/or the extension region implants. This adjustment can also be done prior to gate pattern and etch.

A blocking layer is optionally formed over and covering source/drain regions at block 327. The blocking layer is formed by selectively forming a blocking material such as $CoSi_2$, silicon dioxide, silicon nitride, and the like. It is noted that alternate aspects of the method 300 do not necessarily employ the blocking layer and yet still mitigate the formation of silicide region defects identified in FIG. 3.

A metal, such as nickel, is selectively deposited to substantially cover only the NMOS and PMOS gate structures of the device at block 328. The metal is not substantially deposited on the NMOS and PMOS source/drain regions. By selectively depositing the metal over only the NMOS and PMOS gate structures, the gate structures should react with approximately the same amount of metal (i.e., approximately uniform metal:silicon stoichiometry across the wafer), regardless of the density of gate structures in a given region. Thus, by covering only the NMOS and PMOS gate structures, the devices on the wafer should have a more uniform voltage threshold distribution, relative to previously employed methods where metal was deposited over the entire top surface of the wafer. In some embodiments, for example the embodiments discussed in FIGS. 5 and 6 further herein, electroless plating could be used to perform this selective deposition.

After the metal is selectively deposited on the NMOS and PMOS gate structures (328), the polysilicon gate structures are silicided into a metal silicide in block 330. Typically, full silicidation of the gate layer is obtained by a thermal process, and causes the deposited metal to react fully with the polysilicon of the gate layer. Silicidation does not substantially occur within the source/drain regions because of the selective deposition at block 328.

After the silicidation process, backend processing of the device continues at block 334 and fabrication is completed at block 336. The back end processing can include forming a pre-metal dielectric (PMD) layer over the device, which protects underlying components and transistors from the formed PMD layer and can also act as an etch-stop layer in forming openings for contacts to transistor terminals through the PMD layer. The PMD layer is comprised of a suitable dielectric material, which is deposited followed by a planarization process, such as chemical mechanical planarization (CMP), to planarize a surface of the device. Other features and/or components of the device can also be formed. Conductive contacts are formed through the PMD layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels are layers can then be formed to provide electrical interconnection of the various electrical components in the device, wherein each metallization level includes an inter-level or inter-layer (ILD) dielectric formed over a preceding level, with vias and/or trenches formed therein and filled with a conductive material. Other typical back-end processing may be performed including hydrogen sintering and other processes.

It is appreciated that alternate variations of the method 300 contemplate that performing the electroless deposition of block 328 and the full silicidation of block 330 can be performed after forming the PMD liner and the PMD layer. In such variations, the PMD layer and the PMD liner are removed only over the gate poly thereby exposing only the gate poly and not the source/drain regions. In these variations, the PMD liner and layer serve to protect the source/drain regions and mitigate metal deposition therein and the selective metal deposition would then serve to control the source of metal available for the full silicidation reaction with the gate material.

It is noted that the method 300 describes fabrication of a semiconductor device having NMOS and PMOS regions. It is appreciated that alternate aspects of the invention do not require both and/or separate and distinct NMOS and PMOS regions. For example, some aspects of the invention could be carried out on wafers including only p-type material.

It is also appreciated that variations of the method 300 contemplate employing gate electrode materials other than polysilicon that can be fully silicided with metal. For example, silicon germanium (SiGe) can be employed as a gate electrode material resulting in metal germanosilicide after the full silicidation.

Figure 4A:
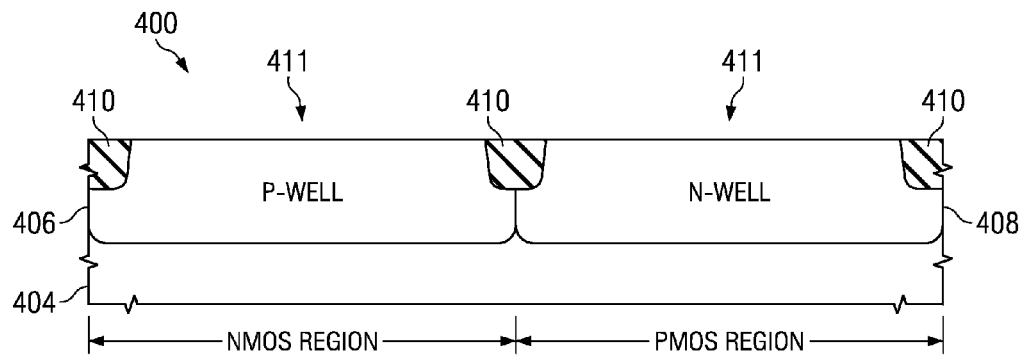
FIGS. 4A to 4K are a plurality of fragmentary cross section diagrams illustrating a transistor device being formed in accordance with the present invention by the method of FIG. 3.
Figure 4B:
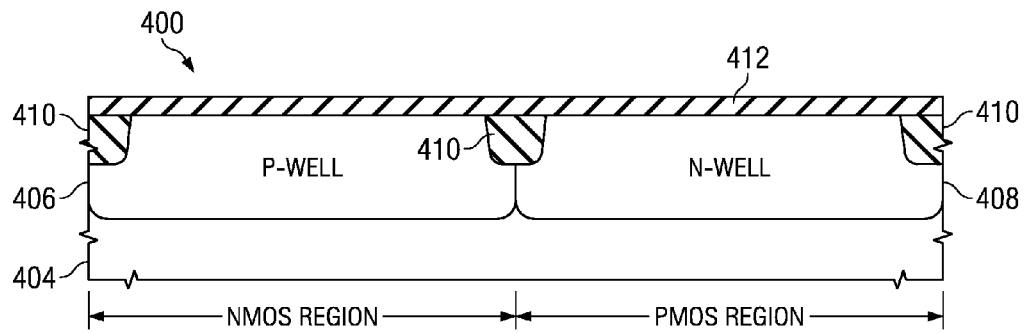

Turning now to FIGS. 4A to 4K, a plurality of fragmentary cross section diagrams illustrating a transistor device being formed in accordance with the present invention by the method 300 of FIG. 3 is provided. In FIG. 4A, a transistor device 400 is provided, wherein a semiconductor body 404, such as a semiconductor substrate, has a number of wells formed therein, including a p-well region 406 to define an NMOS transistor device region and an n-well region 408 to define a PMOS transistor device region. Further, isolation regions 410 such as STI regions are formed in the semiconductor body to define active area regions 411, as may be appreciated. In FIG. 4B, the transistor device 400 is illustrated, wherein a dielectric layer 412 has been formed, for example, by thermally grown $SiO_2$, over the active areas 411.

Figure 4C:
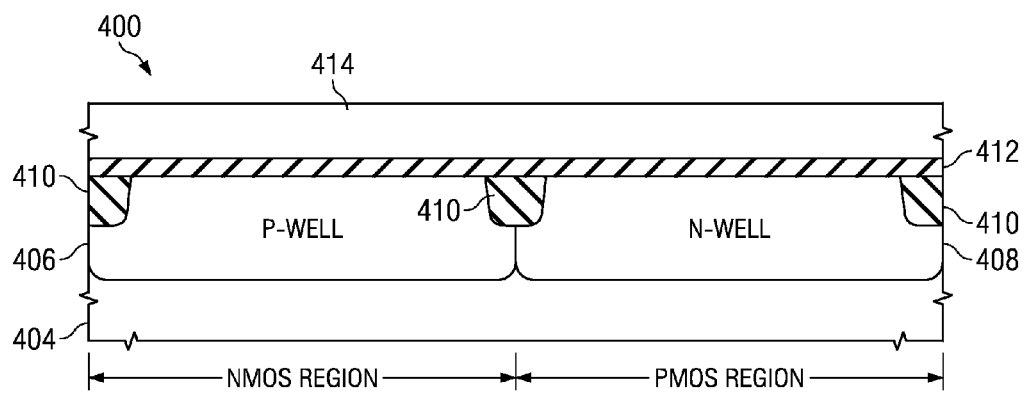
Figure 4D:
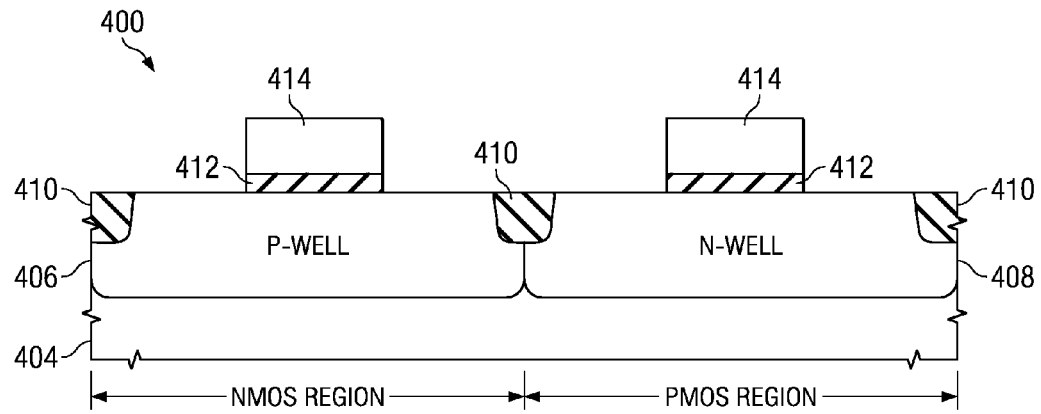
Figure 4E:
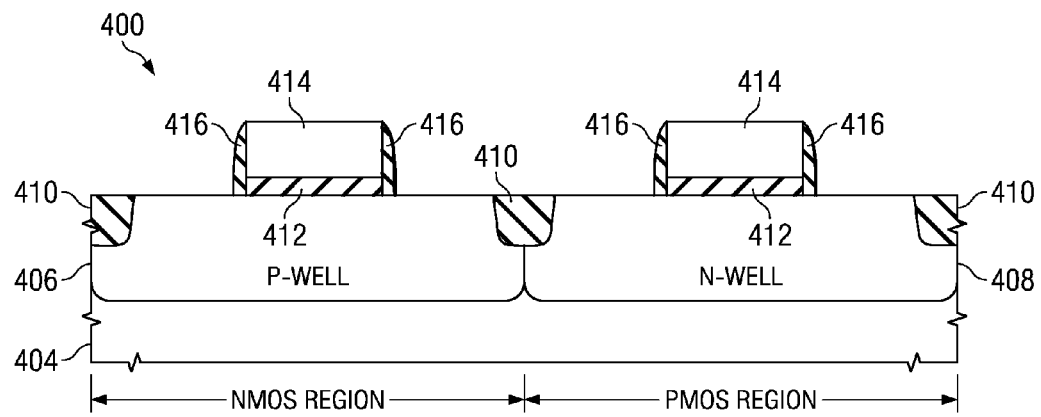

Referring to FIG. 4C, polysilicon has been deposited as a gate electrode layer 414 overlying the dielectric layer 412. The polysilicon is deposited in a blanket operation. Turning now to FIG. 4D, the gate electrode layer 414 and the gate oxide layer 412 are patterned to form gate structures. In some cases, the gate oxide layer 412 is patterned later in the process. Additionally, offset spacers 416 are formed on the lateral edges of the gate structures as shown in FIG. 4E. The offset spacers 416 are comprised of an insulative material, such as silicon nitride, silicon dioxide, or silicon oxynitride and are relatively thin. The offset spacers 416 operate to protect the gate electrodes 414 and to align and define subsequently formed regions.

Figure 4F:
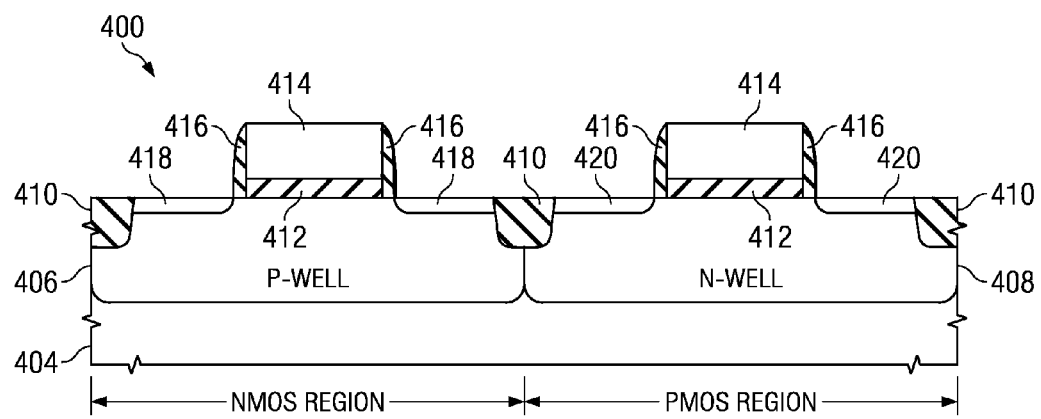

N-type extension regions 418 are formed within the p-well region of the NMOS region and p-type extension regions 420 are formed within the n-well region of the PMOS region as shown in FIG. 4F. To form the n-type extension regions 418, the PMOS region is masked with photoresist, in one example, and an extension region implant is performed to form n-type extension regions 418 in the NMOS region. The mask is then removed and, in another example, the NMOS region is masked with photoresist and a p-type extension region implant is performed to form p-type extension region regions 420 within the PMOS region. A thermal process such as a rapid thermal anneal is typically performed to activate the implanted dopants, wherein a lateral diffusion of the extension regions 418, 420 under the offset spacers 416 can be achieved.

Figure 4G:
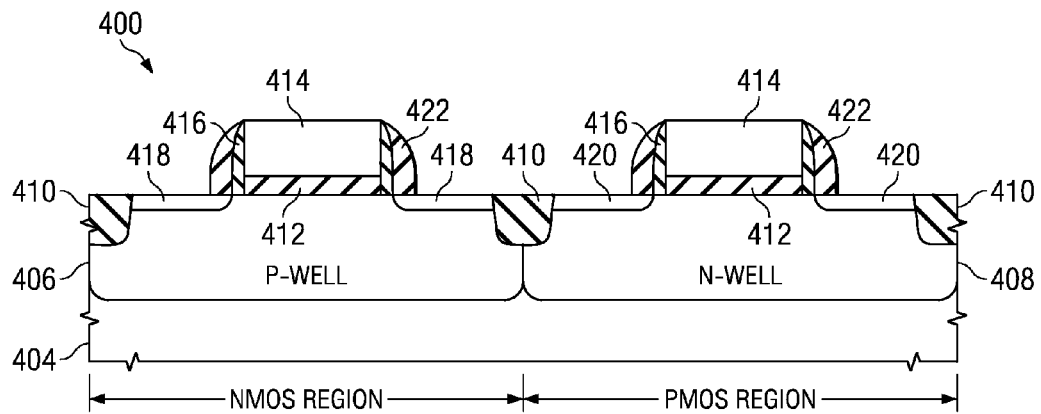

Sidewall spacers 422 are formed adjacent the offset spacers 416 on the lateral edges of the gate structures as shown in FIG. 4G. To form the sidewall spacers 422, insulating sidewall material(s) are deposited in a generally conformal manner over the device and subsequently subjected to an anisotropic etch to remove the insulating material on top of the gate and over the active areas, leaving sidewall spacers 422 in both the NMOS and PMOS regions, as illustrated in FIG. 4G. Some examples of suitable insulative materials include silicon dioxide, silicon nitride or silicon oxynitride.

Figure 4H:
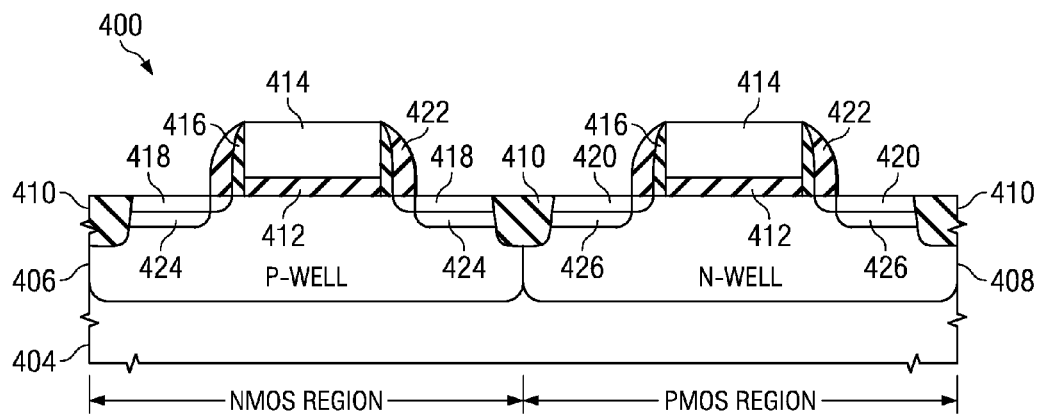

N-type source/drain regions 424 are formed in the NMOS region and p-type source/drain regions 426 are formed in the PMOS region as shown in FIG. 4H. The n-type source and drain regions 424 are formed by a source/drain implant with an NSD mask to implant an n-type dopant in the NMOS region and the p-type source/drain regions 426 are formed by a p-type source/drain implant with a PSD mask to implant a p-type dopant into the PMOS region. It is appreciated that variations of these masks can be employed in the present invention to implant n-type dopants. As can be seen in FIG. 4H, the source/drain regions 424 and 426 are self-aligned with respect to the sidewall spacers 422, and thus are laterally spaced from the extension regions 418 and 420.

Additionally, the gate layer 414 can be implanted with dopants in order to adjust or tune the work function for transistor devices of the PMOS region and the NMOS region. One or more implantations can be performed to obtain varied dopant type and concentrations within the transistor devices. The resulting type and concentrations are a function of desired work functions and threshold voltages for the transistor devices. It is noted that the implants for the gate layer 414 can be formed concurrent with the source/drain implants performed previously.

Figure 4I:
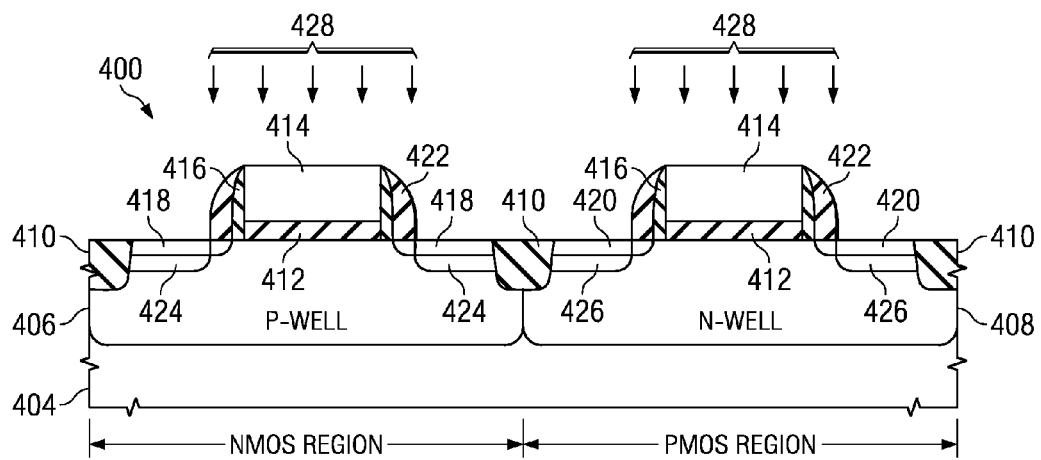
Figure 4J:
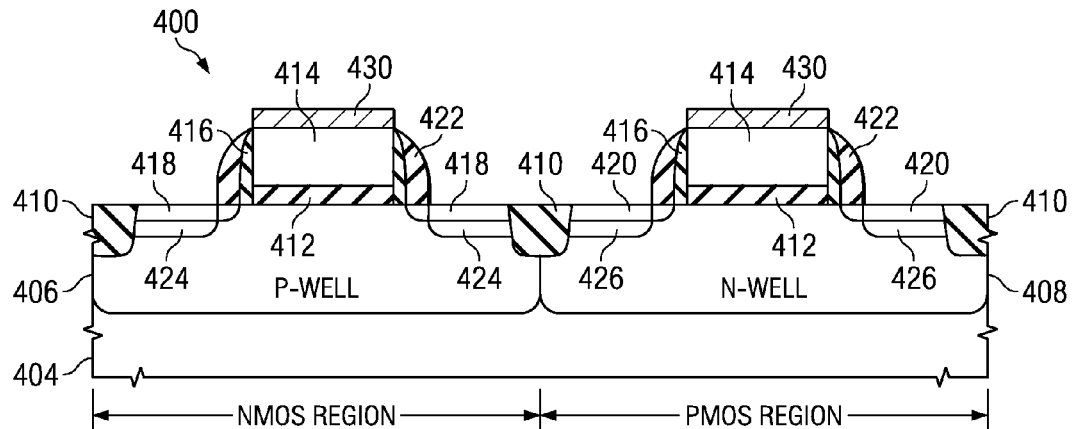

FIG. 4I illustrates the device 400 during a selective deposition process 428 that deposits a metal, such as nickel on only the gate layer 414. A suitable deposition process, such as a selective electroless plating/deposition is employed to deposit the metal on the gate layer 414 without substantially depositing the metal on the NMOS source/drain regions 424 and the PMOS source/drain regions 426. After completing the deposition process 428, a metal layer 430 comprised of the metal is formed on the gate layer 414 as shown in FIG. 4J. As can be seen, the metal layer 430 is not present on the NMOS source/drain regions 424 and the PMOS source/drain regions 426.

Figure 4K:
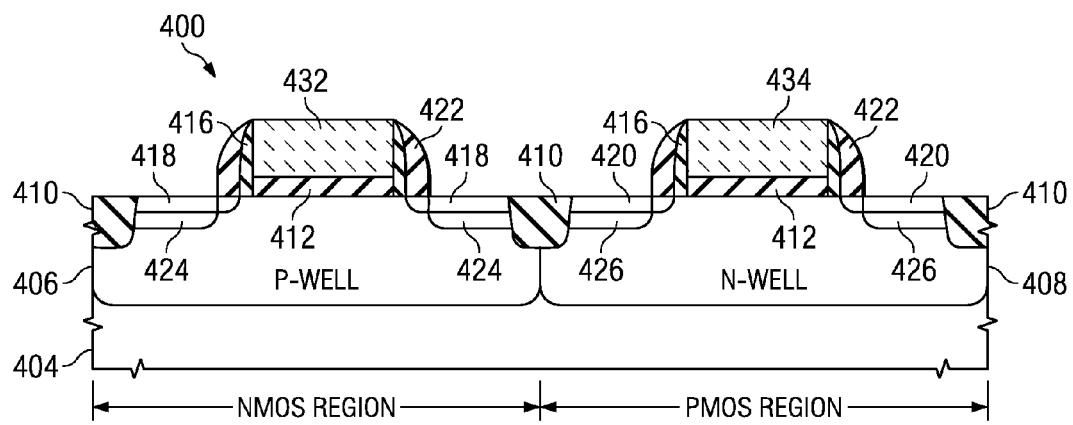

Subsequently, a thermal process is performed that causes full silicidation of the gate layer 414. The thermal process continues for a sufficient time to cause the polysilicon with the gate layer 414 to fully react with the metal within the metal layer 430. This reaction results in a metal silicide material, such as nickel silicide. FIG. 4K depicts the device 400 after conversion of the polysilicon into a metal silicide gate layer 432 in the NMOS region and 434 in the PMOS region.

It is noted that the semiconductor device depicted in FIGS. 4A to 4K is exemplary in nature and intended to facilitate an understanding of the present invention. It is appreciated that variations in thicknesses, layers formed, dimensions, materials employed, and the like are permitted and contemplated in accordance with the present invention.

Figure 5:
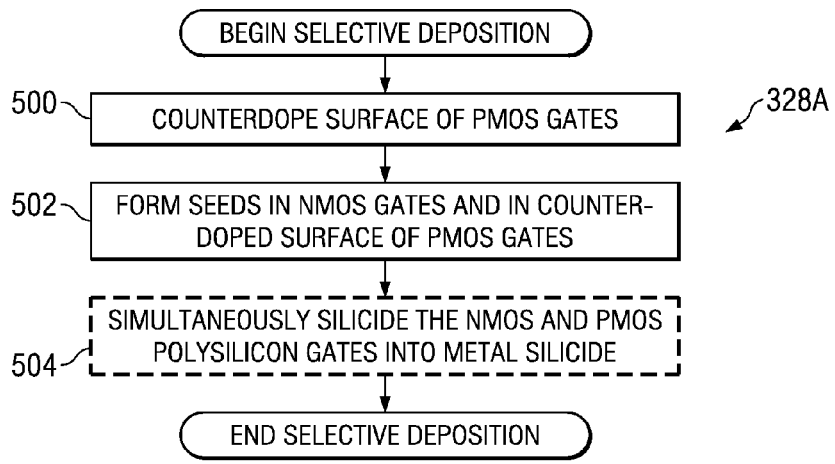
FIG. 5 is a flow diagram illustrating one example of a more detailed method of selective deposition.
Figure 6:
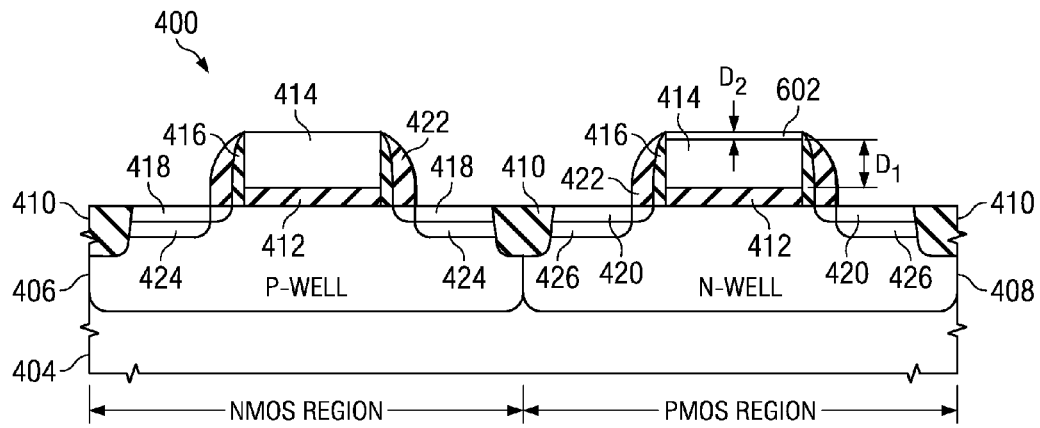
FIG. 6 is a cross section illustrating one example in accordance a block of FIG. 5.

FIGS. 5-6 show some examples of suitable selective depositions 328A, 328B, respectively. These selective depositions are discussed in the context of the previous process flow (e.g., block 328), however, they could also be used in any other process flow. For example, these flows could be used for MEMS processing, or other types of semiconductor processing that do not deal with fully silicided metal gate structures. In formulating these selective depositions, the inventors have appreciated that previous selective depositions were insufficient in some respects.

For example, the inventors have appreciated that electroless deposition of metals on p+ polysilicon is difficult. It is believed to be difficult at least in part because the driving force for the deposition reaction is Fermi level dependent.

Generally speaking, these methods 328A, 328B use an electroless deposition process, in which a solution is used to deposit one or more metals on a catalytic surface without an external source of current. Although some examples are described below where nickel (metal) is deposited on a catalytic surface, it will be appreciated that any other metal could also be deposited on the catalytic surface in other embodiments. During electroless deposition, the metal ions in the plating bath/solution are reduced on a catalytic surface by a reducing agent. If an electroless deposition process is employed at block 328, the plating solution will comprise the desired metal to be deposited on the polysilicon material of the gate layer. Depending upon the selected solution, the metal will not form on the source/drain regions because they fail to serve as a proper catalytic surface. It is also noted that the deposition will not deposit metal on exposed nonconductive oxides or nitrides.

As compared to electroplating, the electroless plating or deposition is a selective process, which can be realized with very thin seed layers or even without the use of seed layers. Since the electroless deposition process is not associated with the use of an external electric current source, the electroless deposition results in relatively uniform coatings in view of the absence of discrete contacts, which are required for electro based deposition processes. Electroless deposition is a controlled autocatalytic chemical reduction reaction of aqueous metal or metal alloy ions to a base or catalytic substrate. That is, the metal or metal alloy being deposited serves to catalyze the reaction.

Typical electroplating procedures use an electroless plating bath. The electroless bath could include an aqueous solution of metal ions, complexing agents, and reducing agents. The bath may also include stabilizers, various additives, and buffers, as well as rate promoters to speed up or slow down the deposition process. As such, the particular composition of the plating bath typically varies based upon the specific application to account for the desired parameters of the plating process. Unlike conventional electroplating however, no electrical current or power supply, anodes, batteries, or rectifiers are required to perform an electroless plating deposition.

Referring now to FIG. 5, one can see a method for selective deposition 328A. At block 500, the exposed uppermost surface of only the PMOS gate structures (or some other p+ material) is counter-doped with an n-type species. Briefly referring to FIG. 6, one can see a p-type polysilicon gate with a first depth $D_1$ and a counter-doped region 602 with a second depth $D_2$. This counter-doped region 602 allows a catalytic surface (e.g., a surface that includes Pd seeds) to form during later processing. The counter-doped region 602 could be formed while a source/drain mask is in place and/or when the gate structures are being tuned (e.g., during a separate implant in FIG. 4J). In various embodiments where the polysilicon gate has depth $D_1$ of greater than approximately 500 Å, the N+ species could be implanted to a depth, $D_2$, of less than approximately 50 Å. That is, the counter-doped region could have a height of approximately less than 10% of the height of the polysilicon gate as shown in FIG. 6.

Referring back to FIG. 5, in block 502, the semiconductor body is immersed in an activation solution to form catalytic seeds in the NMOS gate structures and in the counter-doped region 602 of the PMOS gate structures. Depending upon the selected solution, the catalytic seeds will not form on the source/drain regions 418, 420 because of the chemistry involved. These seeds (e.g., Pd seeds) act as catalysts, which lower the energy needed for the metal reduction reaction to take place. For example, in one embodiment, the activation solution could be a palladium activation solution that comprises: approximately 10 g/L of palladium, approximately 25 mL/L of sulfuric acid ($H_2SO_4$), and approximately 0.5 V % hydrofluoric acid (HF). Further, in one embodiment, the semiconductor body could be immersed in the activation solution for a time period ranging from approximately one minute to approximately ten minutes. In other embodiments, a suitable activation solution will form seeds that are made of noble metals, such as platinum, gold, iridium, palladium, etc.

In block 504, the semiconductor body is immersed in a metal solution, such as a nickel solution, to simultaneously electrolessly plate the NMOS and PMOS polysilicon gate structures 414. During this electroplating process, the catalytic seeds lower the energy needed for the metal reduction reaction to take place, but are not consumed in the reaction. In one embodiment, for example, the metal solution could comprise: approximately 40 mL/L of ammonium hydroxide ($NH_4OH$), approximately 24 g/L of nickel sulfate ($NiSO_4$), approximately 20 g/L of ammonium hypophosphite, and approximately 15 g/L of ammonium citrate.

Notably, in previous processing flows that did not employ shallow counter-doping of the PMOS gate structures, there was insufficient driving force to have catalytic seeds form in the PMOS regions. In other words, although both the NMOS and PMOS gate structures were immersed in the activation solution, catalytic seeds formed only in the NMOS gate structures and not in PMOS gate structures. Therefore, when the semiconductor body was immersed in the metal solution, nickel did not plate on the P+ regions. Therefore, during the subsequent anneal, the P+ regions did not have nickel present to allow silicide formation, and only the NMOS gate structures were silicided. Therefore, in some aspects of the invention, the inventors have appreciated this shortcoming, and fashioned process flows that remedy it.

Whether the catalytic seeds form is a question of whether such formation is energetically favorable. This determination could rest on several variables, one of which is the doping concentration in the exposed counter-doped layer. Of course, whether the catalytic seeds form is also a function of other variables, such as the chemistry of the plating solution, wafer material involved, and whether other sources of energy drive the reaction (e.g., photons, voltage, etc.); and the recited doping concentrations could change as a function of these and other variables.

Figure 7:
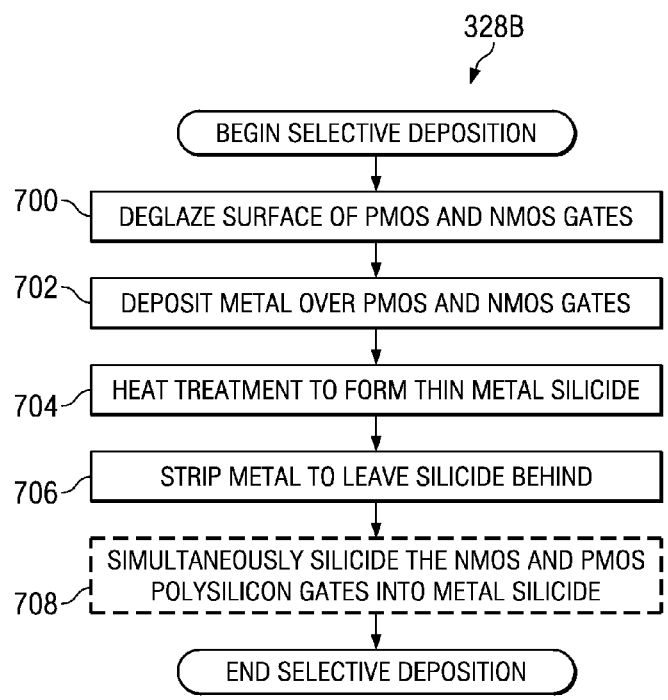
FIG. 7 is a flow diagram illustrating another example of a more detailed method of selective deposition.

Referring now to FIG. 7, one can see another selective deposition 328B that mitigates the difficulty of siliciding p+ polysilicon. This selective deposition 328B starts at 700, where the surface of PMOS and NMOS gate structures are deglazed. In one embodiment, this deglaze could be performed by immersing the semiconductor body in hydrofluoric acid (HF).

At block 702, metal is selectively deposited over only the PMOS and NMOS gate structures. Again, it will be appreciated that this deposition may cover some slight portions of the wafer other than the PMOS and NMOS gate structures. In one embodiment, this metal deposition could be performed by sputtering nickel.

At block 704, a heat treatment is carried out to form a thin metal silicide. For example, in one embodiment, this heat treatment could be carried out at a temperature of between approximately 250° C. and approximately 500° C. Notably, the thickness of the silicide that is formed is small compared to the final silicide thickness. Thus, only a small amount of silicon is consumed (e.g., underneath the silicide, maybe another 90% of the unsilicided poly or single crystal silicon remains.) This will help to preserve the reduction in metal (e.g., Ni) to Silicon, thereby preserving the stoichiometry control gained with the electroless plating approach.

At block 706, a strip is performed on the thin metal silicide so as to remove any unreacted metal while leaving the silicide on the surface of the wafer. In one embodiment, this strip could be achieved by using sulfuric peroxide or phosphoric peroxide.

Because a silicide (e.g., nickel silicide) is now present on the surface of the gate structures, the NMOS and PMOS polysilicon gate structures are simultaneously silicided into a metal silicide at block 708. Because nickel silicide is a good catalyst for electroless nickel deposition, this approach allows silicide to be formed on a p+ silicon surface via an electroless plating process. Electroless plating processes as previously described could be used in block 708.

In still another embodiment, additional energy in the form of photons could be supplied to form the catalytic surface on the p+ material. Thus, an electroless plating cell could be designed with a pane that allows the wafer to be irradiated with light (e.g. UV light) while it is immersed in the electroplating bath. Thus, the UV light could supply the necessary energy to drive the electroless plating reaction on the p+ silicon. In one embodiment, for example, this pane could be a quartz pane that has a high transmission coefficient at UV wavelengths. To maximize the amount of UV light to the wafer, the cell could use a thin layer of electrolyte.

As well as improving the speed of seed deposition on P+ silicon, the methods disclosed herein can also speed up seed deposition onto "intrinsic"-silicon, N− silicon, and polysilicon. Seed deposition is accomplished by replacement plating where HF etches to silicon and thereby liberates electrons which are accepted by the metal being plated. While the seed is being deposited, any exposed oxide (e.g., $SiO_2$) is etched. As the Fermi level moves away from N+ and towards P+, the rate at which metal seed is deposited in the HF bath is decreased. This means that the wafers should be left longer in the seed solution so more oxide will be etched. Often the amount of time required to deposit a sufficient amount of seed on a lightly doped or intrinsic silicon surface will result an unacceptably large amount of oxide loss. In this case, the inventions will also benefit lightly doped p, n, or intrinsic silicon surfaces, i.e. cases where the fermi energy lies near the mid-gap. Thus, the invention would be applicable to surfaces that were lower (more positive) in energy than 0.4 EV below the conduction band edge.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating an integrated circuit, comprising:
    providing a p-type doped polysilicon gate structure and an n-type doped polysilicon gate structure on a semiconductor body;
    implanting the p-type doped polysilicon gate structure with an n-type dopant species to form a counter-doped region in a top portion of the p-type doped polysilicon gate structure, the counter-doped region extending less than 10% into the p-type doped polysilicon gate structure;
    following the counter-doping, immersing the semiconductor body in an activation solution to simultaneously form catalytic seeds in the n-type doped polysilicon gate structure and in the counter-doped region of the p-type doped polysilicon gate structure;
    following the catalytic seed formation, immersing the semiconductor body in a metal solution to simultaneously and selectively electrolessly metal plate the n-type and p-type doped polysilicon gate structures; and
    performing a thermal process to cause the n-type and p-type doped polysilicon gate structures to react with the plated metal to convert the polysilicon into metal silicide.

2. The method of claim 1, wherein the catalytic seeds comprise a noble metal; and wherein the plated metal is nickel.

3. The method of claim 1, wherein the p-type doped polysilicon structure is a patterned gate layer having a thickness of at least 500 angstroms and the counter-doped region is formed at a top surface of the patterned gate layer to a depth of less than 50 angstroms.

4. The method of claim 1, wherein the metal solution is a nickel solution; and the plated metal is nickel.

5. The method of claim 4, wherein the metal solution comprises ammonium hydroxide, nickel sulfate, ammonium hydrophosphite, and ammonium citrate.

6. The method of claim 5, wherein the metal solution comprises approximately 40 mL/L of ammonium hydroxide, approximately 24 g/L of nickel sulfate, approximately 20 g/L of ammonium hydrophosphite, and approximately 15 g/L of ammonium citrate.

7. The method of claim 1, wherein the activation solution comprises a palladium activation solution; and the catalytic seeds comprise palladium.

8. The method of claim 7, wherein the activation solution comprises palladium, sulfuric acid, and hydrofluoric acid.

9. The method of claim 8, wherein the activation solution comprises approximately 10 g/L of palladium, approximately 25 mL/L of sulfuric acid, and approximately 0.5 V % hydrofluoric acid.

10. The method of claim 7, wherein the metal solution is a nickel solution; the plated metal is nickel; and the p-type and n-type doped polysilicon structures are formed by depositing and patterning a layer of polysilicon material to define gate structures of PMOS and NMOS transistors; the thermal process causing the p-type and n-type doped polysilicon structures to be fully silicided.

11. A method of fabricating an integrated circuit, comprising:
    forming well regions and isolation regions to define PMOS and NMOS regions within a semiconductor body;
    forming a dielectric layer over the PMOS and NMOS regions;
    forming a polysilicon layer over the dielectric layer;
    patterning the polysilicon and the dielectric layers to form polysilicon gate structures in the PMOS and NMOS regions;
    implanting the NMOS region and the polysilicon gate structure in the NMOS region to form n-type doped source/drain regions adjacent an n-type doped polysilicon gate structure in the NMOS region;
    implanting the PMOS region and the polysilicon gate structure in the PMOS region to form p-type doped source/drain regions adjacent a p-type doped polysilicon gate structure in the PMOS region;
    implanting the p-type doped polysilicon gate structure with an n-type dopant species to form a counter-doped region at a top surface of the p-type doped polysilicon gate structure, the counter-doped region extending below the top surface by less than 10% of a thickness of the p-type doped polysilicon gate structure;
    following the counter-doping, immersing the semiconductor body in an activation solution to simultaneously form catalytic seeds in the n-type doped polysilicon gate structure and in the counter-doped region of the p-type doped polysilicon gate structure;
    following the catalytic seed formation, immersing the semiconductor body in a metal solution to simultaneously and selectively electrolessly metal plate the n-type and p-type doped polysilicon gate structures; and
    performing a thermal process to cause the n-type and p-type doped polysilicon gate structures to react with the plated metal to convert the polysilicon into metal silicide.

12. The method of claim 11, wherein the catalytic seeds comprise a noble metal; and wherein the plated metal is nickel.

13. The method of claim 11, further comprising forming a blocking layer that covers the source/drain regions but leaves the gate p-type and n-type doped polysilicon gate structures prior to selectively depositing the metal.

14. The method of claim 13, wherein the blocking layer is comprised of silicon dioxide or silicon nitride.

15. The method of claim 11, wherein the metal solution is a nickel solution; and the plated metal is nickel.

16. The method of claim 15, wherein the activation solution comprises a palladium activation solution; and the catalytic seeds comprise palladium.

17. The method of claims 16, wherein the thermal process causes the p-type and n-type doped polysilicon gate structures to be fully silicided.

18. The method of claim 17, wherein the metal solution comprises ammonium hydroxide, nickel sulfate, ammonium hydrophosphite, and ammonium citrate.

19. The method of claim 18, wherein the activation solution comprises palladium, sulfuric acid, and hydrofluoric acid.

20. The method of claim 11, wherein the activation solution comprises a palladium activation solution; and the catalytic seeds comprise palladium.

21. The method of claims 11, wherein the thermal process causes the p-type and n-type doped polysilicon gate structures to be fully silicided.

22. The method of claim 11, wherein the metal solution comprises ammonium hydroxide, nickel sulfate, ammonium hydrophosphite, and ammonium citrate.

23. The method of claim 11, wherein the activation solution comprises palladium, sulfuric acid, and hydrofluoric acid.

* * * * *